United States Patent
Liu et al.

(10) Patent No.: US 6,589,854 B2
(45) Date of Patent: Jul. 8, 2003

(54) METHOD OF FORMING SHALLOW TRENCH ISOLATION

(75) Inventors: Wan-Yi Liu, Chien-Chen District (TW); Ping-Yi Chang, Da-Liao Hsiang (TW)

(73) Assignee: Macronix International Co., Ltd., Hsinchu (TW)

( * ) Notice: Subject to any disclaimer, the term of this patent is extended or adjusted under 35 U.S.C. 154(b) by 17 days.

(21) Appl. No.: 09/974,580

(22) Filed: Oct. 9, 2001

(65) Prior Publication Data

US 2002/0197822 A1 Dec. 26, 2002

(30) Foreign Application Priority Data

Jun. 26, 2001 (TW) ........................ 90115359 A

(51) Int. Cl.[7] .................. H01L 21/76; H01L 21/311
(52) U.S. Cl. ............... 438/435; 438/437; 438/700; 438/703; 257/506; 257/524
(58) Field of Search .................. 438/435, 437, 438/640, 355, 580, 359, 695–703, 424–429; 257/622, 623, 506, 524

(56) References Cited

U.S. PATENT DOCUMENTS

| | | | | |
|---|---|---|---|---|
| 5,968,610 A | * | 10/1999 | Liu et al. | 427/579 |
| 6,037,018 A | * | 3/2000 | Jang et al. | 427/579 |
| 6,093,634 A | * | 7/2000 | Chen et al. | 438/622 |
| 6,191,004 B1 | * | 2/2001 | Hsiao | 438/435 |
| 6,207,538 B1 | * | 3/2001 | Pan et al. | 438/510 |
| 6,331,472 B1 | * | 12/2001 | Liu et al. | 438/424 |
| 6,410,446 B1 | * | 6/2002 | Tsai et al. | 438/695 |

* cited by examiner

Primary Examiner—Matthew Smith
Assistant Examiner—Calvin Lee
(74) Attorney, Agent, or Firm—J. C. Patents

(57) ABSTRACT

A method of forming a shallow trench isolation structure. A pad oxide layer and a mask layer are sequentially formed over a substrate. A portion of the pad oxide layer, mask layer and substrate are removed to form a trench in the substrate. A first stage high-density plasma chemical vapor deposition having a high etching/deposition ratio is conducted to form a layer of insulation material over the substrate. A second stage high-density plasma chemical vapor deposition having a lower etching/deposition rate is conducted to form a second layer of insulation material over the substrate and completely fills the trench. Insulating material outside the trench region is removed. Finally, the mask layer and the pad oxide layer are sequentially removed to form a complete STI structure.

16 Claims, 5 Drawing Sheets

METHOD OF FORMING SHALLOW TRENCH ISOLATION

CROSS-REFERENCE TO RELATED APPLICATION

This application claims the priority benefit of Taiwan application serial no. 90115359, filed Jun. 26, 2001.

BACKGROUND OF THE INVENTION

1. Field of Invention

The present invention relates to an electrical insulation structure and its method of manufacture. More particularly, the present invention relates to a shallow trench isolation (STI) structure and its method of manufacture.

2. Description of Related Art

Following the rapid advance in semiconductor manufacturing technologies, the level of integration is increased. As the dimensions of each device are reduced, an electrical insulating structure such as a layer of silicon oxide formed by a local oxidation (LOCOS) is unsatisfactory. At present, the most widely adopted method for electrical isolation is shallow trench isolation (STI).

In general, the silicon oxide within an STI structure is deposited by a high-density plasma chemical vapor deposition (HDPCVD) method. The HDPCVD method is actually a process that provides two concurrent mechanisms, namely, etching and deposition. In other words, a portion of the drop-off material is simultaneously etched during deposition. Hence, the process is able to provide a high gap-filling capacity ideal for depositing silicon oxide into a shallow trench structure.

FIGS. 1A through 1D are schematic cross-sectional views showing the progression of steps for forming a shallow trench isolation (STI) structure according to a conventional method. As shown in FIG. 1A, a substrate is provided. A pad oxide layer 102 and a silicon nitride mask layer 104 are sequentially formed over the substrate 100. An anisotropic etching is conducted to remove a portion of the silicon nitride mask layer 104, the pad oxide layer 102 and the substrate 100 to form a trench 106. After the anisotropic etching, a rounded corner structure 108 is also formed near the top of the trench 106. The reason for forming the rounded corners 108 is because a sharp corner often leads to an insufficient thickness of subsequently formed gate oxide layer resulting in a leakage current. A rounded structure 108 can prevent such leakage due to an uneven gate layer thickness.

As shown in FIG. 1B, a high-density plasma chemical vapor deposition (HDPCVD) process is conducted. A silicon oxide layer 110 is formed over the entire substrate 100 completely filling the trench 106. Although HDPCVD provides high gap-filling capacity for silicon oxide, deposition on the trench wall near the rounded structure 108 often leads to the formation of blobs of silicon oxide that prevents the filling of oxide material underneath. Consequently, a weak spot 112 is created around that region.

As shown in FIG. 1C, chemical-mechanical polishing (CMP) of the silicon oxide layer 110 is conducted to remove a portion of the silicon oxide material outside the trench 106. The silicon nitride mask layer 104 serves as a polishing stop layer.

As shown FIG. 1D, a wet etching process is conducted to remove the silicon nitride mask layer 104 and the pad oxide layer 102 sequentially, ultimately forming an STI structure 114.

However, because the weak spots 112 are a region without silicon oxide filling, recess cavities 116 are formed at the upper corner of the trench 106 next to the substrate 100 in the final STI structure 114. Such recess cavities 116 at the corner region of an STI structure not only expose the substrate 100, but also render the exposed section of the substrate 100 vulnerable to damages in subsequent processing.

In the aforementioned process, the recess cavities 116 at the upper corners of the trench structure expose a portion of the substrate 100 and the exposed portion is vulnerable to processing damages. In addition, the recess cavity areas 116 are often centers for charge accumulation, leading to possible leakage current and a lowering of the threshold voltage of a gate oxide layer.

To reduce the formation of weak spots, a high-density plasma chemical vapor deposition (HDPCVD) process having a high etching/deposition ratio is often used to deposit insulating material into the trench of an STI structure. Because a higher etching/deposition ratio increases gap-filling capacity of a HDPCVD process and also induces a "re-deposition" effect, thus no weak spots are formed during insulating material deposition. However, a HDPCVD with a high etching/deposition has a lower deposition rate and hence is likely to decrease overall throughput of production.

SUMMARY OF THE INVENTION

Accordingly, one object of the present invention is to provide a method of forming a shallow trench isolation (STI) structure capable of preventing the formation of weak spots after insulating material deposition.

A second object of this invention is to provide a method of forming a shallow trench isolation (STI) structure capable of preventing the formation of recess cavities that expose the substrate at the corner regions of the STI structure. Thus, damages to the substrate during subsequent processing are minimized.

A third object of this invention is to provide a method of forming a shallow trench isolation (STI) structure capable of preventing the formation of a recess cavity at the corner of the STI structure so that current leakage from the cavity region is avoided.

A fourth object of this invention is to provide a method of forming a shallow trench isolation (STI) structure capable of providing a balance between the number of weak spots created within the STI structure and the throughput of production so that an optimal production efficiency is obtained.

To achieve these and other advantages and in accordance with the purpose of the invention, as embodied and broadly described herein, the invention provides a method of forming an STI structure. First, a substrate is provided. A pad oxide layer is formed over the substrate. A mask layer is formed over the pad oxide layer. The substrate is patterned to form a trench in the substrate. A high-density plasma chemical vapor deposition (HDPCVD) is conducted to form an insulation layer over the substrate that also completely fills the trench. The HDPCVD is conducted in two separate stages. In the first stage, a HDPCVD process with a higher etching/deposition ratio is used so that the formation of weak spots inside the insulating material is prevented. In the second stage, a HDPCVD process with a lower etching/deposition ratio is used so that a higher depositing rate than the depositing rate in the first stage results. Hence, the overall throughput in the two-stage HDPCVD deposition is increased over a one-stage HDPCVD deposition employing a high etching/deposition ratio, and at the same time without creating too many internal weak spots. Thereafter, insulating material outside the trench region is removed. Finally, the mask layer and the pad oxide layer are sequentially removed to form a complete STI structure.

One major aspect of this invention is the use of a two-stage high-density plasma chemical vapor deposition to form an insulation layer over the substrate. Since a higher etching/deposition ratio increases gap-filling capacity and induces a "re-deposition" effect, no weak spots are formed in the first stage HDPCVD process.

Once the first stage HDPCVD process resolves the weak spot issue, a second stage HDPCVD process using a lower etching/deposition ratio can be employed. Since the deposition rate is higher for a HDPCVD process at a lower etching/deposition ratio, overall throughput is increased leading to higher production efficiency.

In addition, all two HDPCVD processing stages can be carried out inside the same reaction chamber. Since no additional equipment or step is required, no other cost or additional processing complexity is incurred.

Since the insulation layer is free of any weak spots, a recess cavity that exposes a portion of the substrate is absent from the STI structure. Hence, damages to the exposed substrate near the recess cavity are prevented.

Furthermore, the absence of recess cavities around the STI structure also prevents any accumulation of electric charges in subsequent formation of a gate oxide layer. Ultimately, the source of leakage current is removed and a lowering of threshold voltage for the gate oxide layer is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
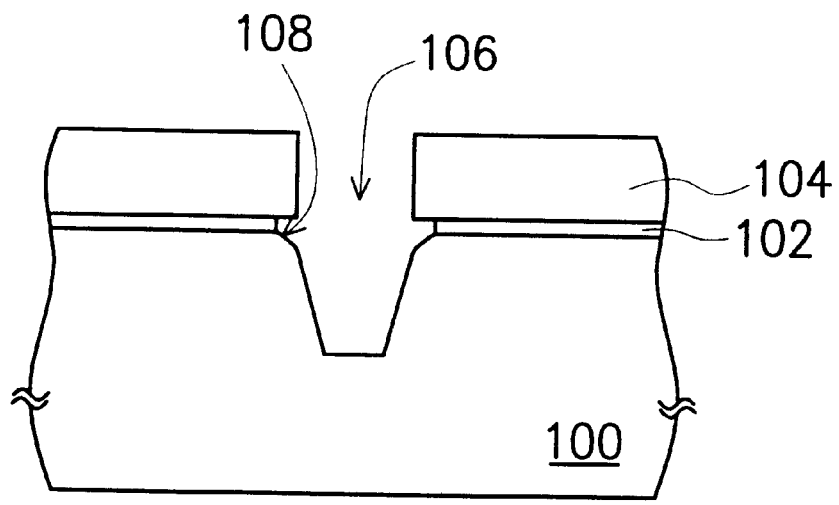
FIGS. 1A through 1D are schematic cross-sectional views showing the progression of steps for forming a shallow trench isolation (STI) structure according to a conventional method.
Figure 1B:
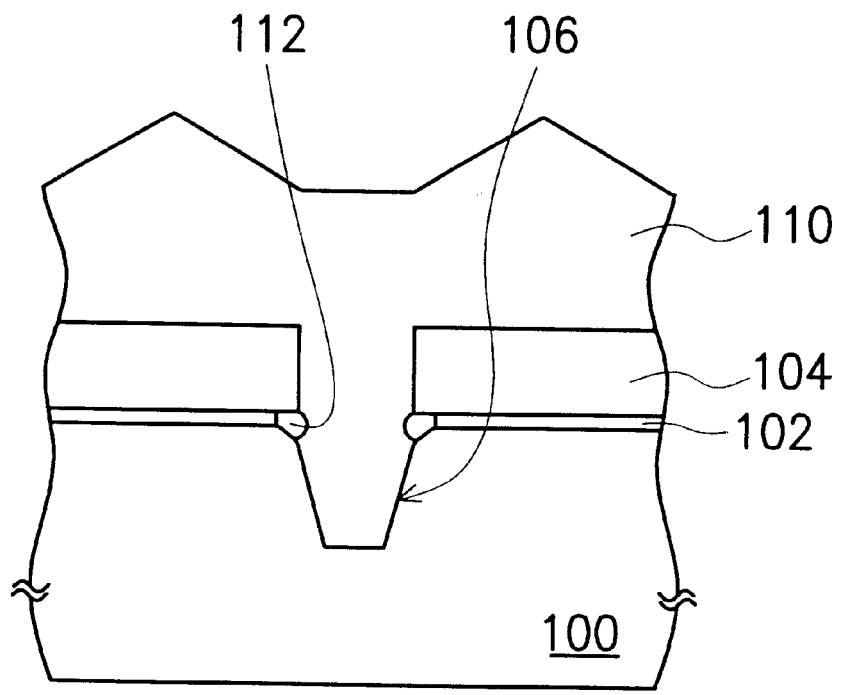
Figure 1C:
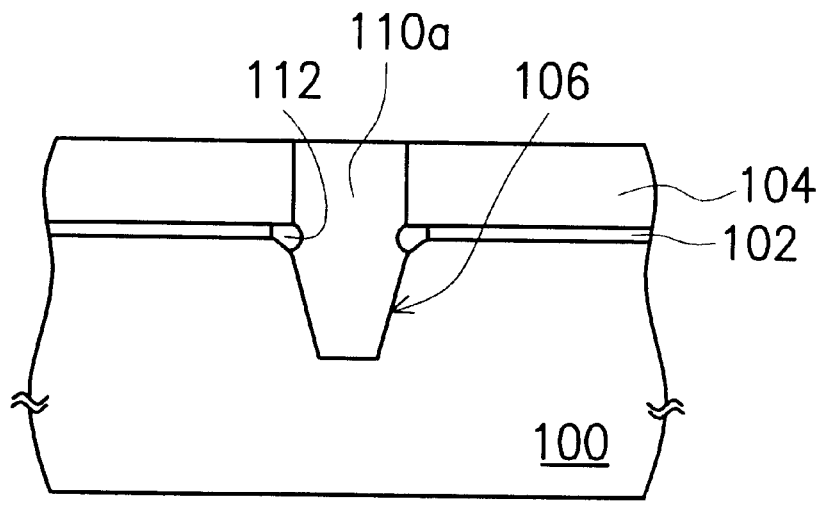
Figure 1D:
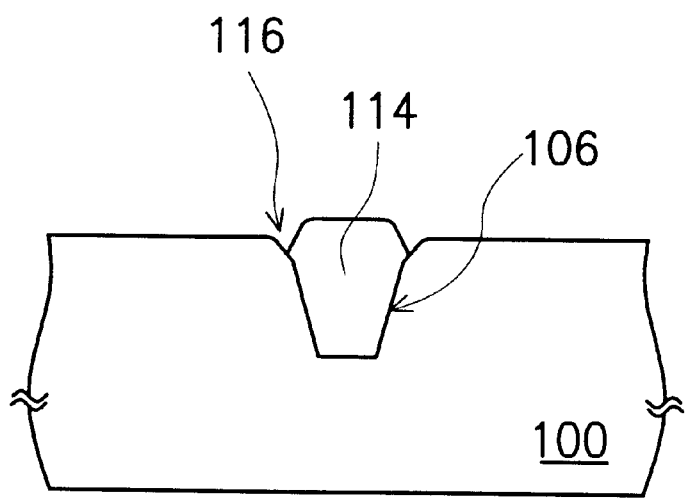

Reference will now be made in detail to the present preferred embodiments of the invention, examples of which are illustrated in the accompanying drawings. Wherever possible, the same reference numbers are used in the drawings and the description to refer to the same or like parts.

Figure 2A:
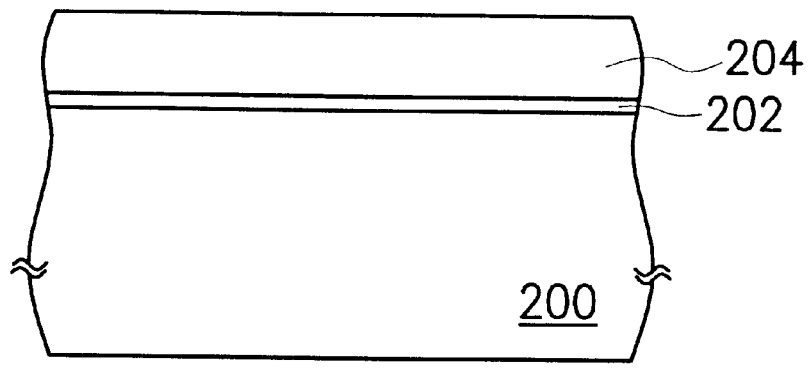
FIGS. 2A through 2F are schematic cross-sectional views showing the progression of steps for forming a shallow trench isolation (STI) structure according to one preferred embodiment of this invention.

FIGS. 2A through 2F are schematic cross-sectional views showing the progression of steps for forming a shallow trench isolation (STI) structure according to one preferred embodiment of this invention. As shown in FIG. 2A, a substrate 200 is provided. A pad oxide layer 202 is formed over the substrate 200. The pad oxide layer 202 can be a silicon oxide layer formed, for example, by thermal oxidation. A mask layer 204 is formed over the pad oxide layer 202. The mask layer 204 can be a silicon nitride layer formed, for example, by chemical vapor deposition.

Figure 2B:
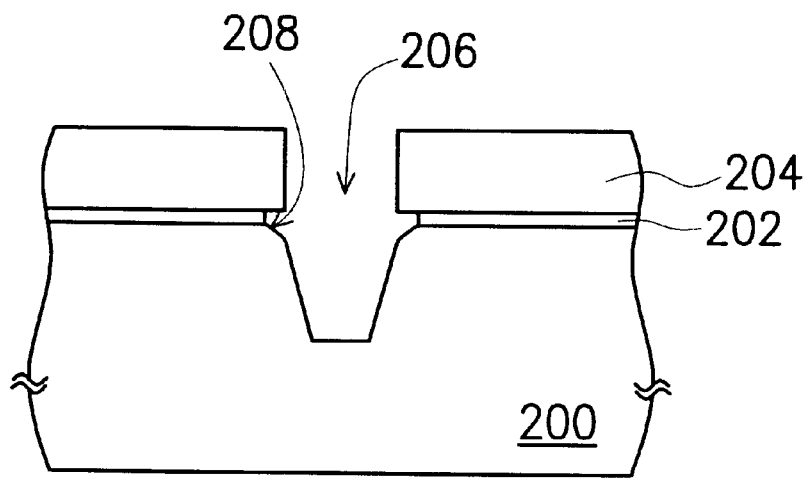

As shown in FIG. 2B, a portion of the mask layer 204, the pad oxide layer 202 and the substrate 200 are removed to form a trench 206 in the substrate 200. The trench 206 is formed, for example, by forming a patterned photoresist layer (not shown) over the mask layer 204 and performing an anisotropic etching using the patterned photoresist layer as a mask. After the anisotropic etching, rounded corner structures 208 are formed at the upper corner regions of the trench 206.

Figure 2C:
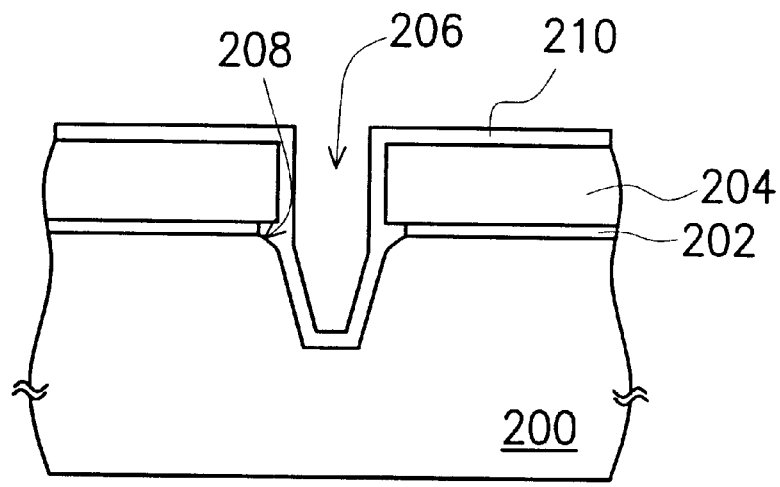

As shown in FIG. 2C, a first high-density plasma chemical vapor deposition (HDPCVD) having a higher etching/deposition ratio is conducted inside a reaction chamber to form an insulation layer 210 over the substrate 200. The first insulation layer 210 should at least cover the hole which is underneath the mask layer 204 and the thickness of the insulation layer 210 is around 200~300 Å. The insulation layer 210 can be, for example, a silicon oxide layer. In the first HDPCVD process, an etching/deposition ratio of between about 0.15 and 0.6 is used. To produce such a high etching/deposition ratio for the HDPCVD process, the ratio of silane to oxygen in the gaseous reactive mixture is lowered and the operating power of the high frequency radio frequency (HFRF) is increased, for example. Typically, the first HDPCVD process is conducted, a low frequency radio frequency (LFRF) power of between about 2700W and 4500W, and a high frequency radio frequency (HFRF) power of between about 2700W and 4000W. The gaseous mixture needed to conduct the HDPCVD is produced by introducing silane, oxygen and nitrogen at flow rates of 80 sccm–150 sccm, about 120 sccm-210 sccm and about 180 sccm–280 sccm, respectively.

In the first HDPCVD step, the insulation layer 210 is formed at a high etching/deposition ratio. In other words, a HDPCVD process with a higher etching capacity is used. Since any material deposited on the sidewall of the trench 206 is rapidly removed without forming any obstacle items that prevent subsequent deposition, a HDPCVD process operating with a high etching/deposition ratio has exceptional gap-filling capacity. The first insulation layer 210 should at least cover the hole which is underneath the mask layer 204 and the thickness of the insulation layer 210 is around 200~300 Å. Hence, the trench 206 is completely filled by the insulating material, and the insulating material includes no weak spots.

Figure 2D:
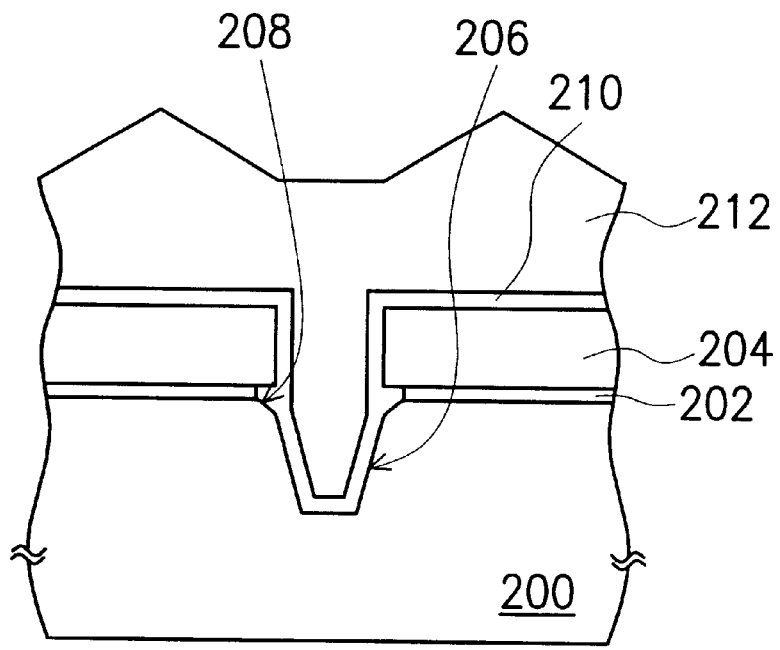

As shown in FIG. 2D, a second HDPCVD process is carried out inside the same reaction chamber to form another insulation layer 212 that covers the mask layer 204 and completely fills the trench 206. The insulation layer 212 can be, for example, a silicon oxide layer. In the second HDPCVD process, a relatively low etching/deposition ratio of about 0.02~0.15 is used. To produce such a low etching/deposition ratio for the HDPCVD process, the operating power of the high frequency radio frequency (HFRF) is lowered while the operating power of the low frequency radio frequency (LFRF) is increased, for example. Typically, the first HDPCVD process is conducted, a low frequency radio frequency (LFRF) power of about 3700W-5000W and a high frequency radio frequency (HFRF) power of about 1400W-2700W. The gaseous mixture needed to conduct the HDPCVD is produced by introducing silane, oxygen and nitrogen at flow rates of about 100 sccm–200 sccm, about 180 sccm–280 sccm and about 350 sccm–460 sccm, respectively.

Since the first HDPCVD process has already resolved the weak spot problem for insulating material inside the trench 206, a HDPCVD process with a lower etching/deposition ratio and hence a faster depositing rate can be used to produce the insulation layer 212. Ultimately, a proper balance between forming an insulation layer free of weak spots and producing the insulation layer at a quicker speed is struck. Furthermore, because both the first and the second HDPCVD process are conducted inside the same reaction chamber, no additional processing step or complication is incurred.

Figure 2E:
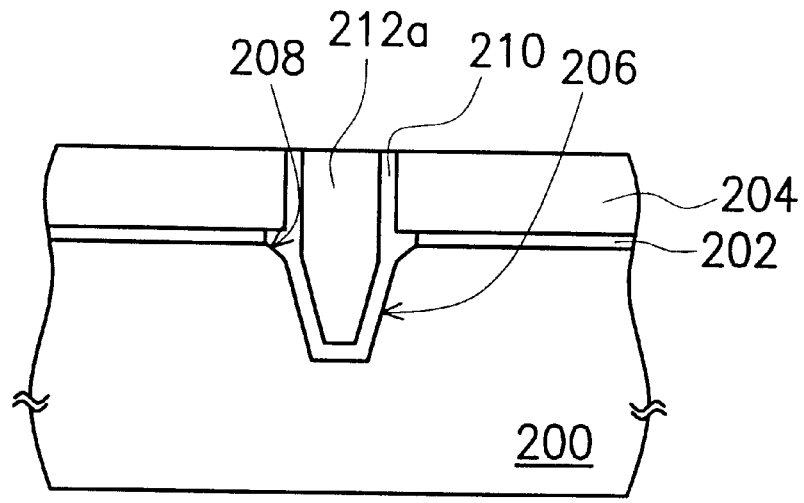

As shown in FIG. 2E, the insulation material outside the trench 206 is removed to form a plug of oxide material 212a inside the trench 206. Excess insulation material can be removed from the insulation layer 212 by chemical-mechanical polishing (CMP) using the mask layer 204 as a polishing stop layer.

Figure 2F:
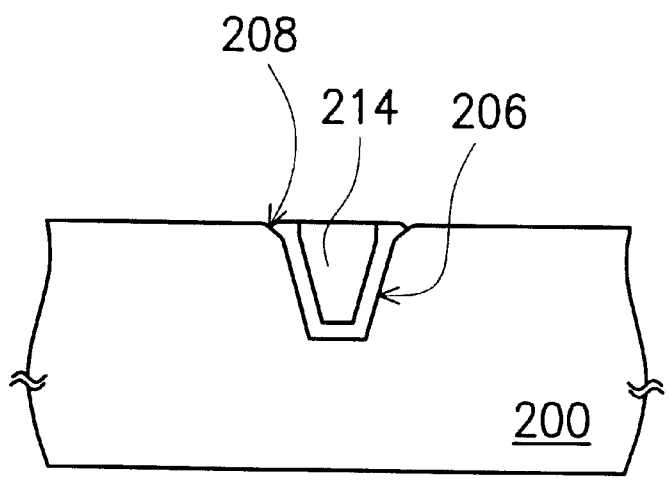

As shown in FIG. 2F, the mask layer 204 and the pad oxide layer are sequentially removed to form a complete STI structure 214. The mask layer 204 can be removed, for example, by immersing the substrate 200 in a bath of hot phosphoric acid in a wet etching operation. The pad oxide layer 202 is removed, for example, by immersing the substrate 200 in a both of hydrofluoric acid solution in a wet etching operation.

In conclusion, one major aspect of this invention is the use of a two-stage high-density plasma chemical vapor deposition to form an insulation layer over the substrate. A high-density plasma chemical vapor deposition with a higher etching/deposition ratio is used in the first stage. Since a higher etching/deposition ratio increases gap-filling capacity and induces a "re-deposition" effect, no weak spots are formed in the first stage HDPCVD process.

Since the first stage HDPCVD process has already resolved the weak spot issue, a second stage HDPCVD process using a lower etching/deposition ratio can be employed. Since the deposition rate is higher for a HDPCVD process at a lower etching/deposition ratio, overall throughput is increased leading to higher production efficiency.

In addition, all two HDPCVD stages are conducted inside the same reaction chamber. Since no additional equipment or step is required, no other cost or additional processing complexity is incurred.

Since the insulation layer is free of any weak spots, a recess cavity that exposes a portion of the substrate is absent from the STI structure. Hence, damages to the exposed substrate near the recess cavity are prevented.

Furthermore, the absence of recess cavities around the STI structure also prevents any accumulation of electric charges in subsequent formation of a gate oxide layer. Ultimately, the source of leakage current is removed and a lowering of threshold voltage for the gate oxide layer is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a shallow trench isolation (STI) structure, comprising:
   providing a substrate;
   forming a pad oxide layer over the substrate;
   forming a mask layer over the pad oxide layer;
   patterning the substrate to form a trench in the substrate, wherein upper corners of the trench are rounded and a recess cavity is formed;
   conducting a high-density plasma chemical vapor deposition to form an insulation layer that covers mask layer and completely fills the trench, wherein the high-density chemical vapor deposition process is performed in two stages, a first stage and a second stage, wherein the first stage is carried out at a first etching/deposition ratio to fill the recess cavity and the second stage is carried out at a second etching/deposition ratio lower than that of the first stage to fill a remaining of the trench.

2. The method of claim 1, wherein the first stage high-density plasma chemical vapor deposition is conducted at the first etching/deposition ratio of about 0.15 to 0.6 and the second stage high-density plasma chemical vapor deposition is conducted at the second etching/deposition ratio of about 0.02 to 0.15.

3. The method of claim 2, wherein the first stage high-density plasma chemical vapor deposition is conducted by applying a low frequency radio frequency at a power level of about 2700W to 4500W, and a high frequency radio frequency at a power level of about 2700W to 4000W, and using a mixture of gaseous reactants including silane, oxygen and nitrogen.

4. The method of claim 3, wherein the mixture of gaseous reactants in the first stage high-density plasma chemical vapor deposition is produced by introducing silane at a flow rate of about 80 sccm to 150 sccm, oxygen at a flow rate of about 120 sccm to 210 sccm and nitrogen at a flow rate of about 180 sccm to 280 sccm.

5. The method of claim 2, wherein the second stage high-density plasma chemical vapor deposition is conducted by applying a low frequency radio frequency at a power level of about 3700W to 5000W and a high frequency radio frequency at a power level of about 1400W to 2700W, and using a mixture of gaseous reactants including silane, oxygen and nitrogen.

6. The method of claim 5, wherein the mixture of gaseous reactants in the second stage high-density plasma chemical vapor deposition is produced by introducing silane at a flow rate of about 100 sccm to 200 sccm, oxygen at a flow rate of about 180 sccm to 280 sccm and nitrogen at a flow rate of about 350 sccm to 460 sccm.

7. The method of claim 1, wherein the insulation layer includes a silicon oxide layer.

8. A method of forming a shallow trench isolation (STI) structure, comprising:
   providing a substrate having a trench therein;
   forming a pad oxide layer over the substrate;
   forming a mask layer over the pad oxide layer;
   forming a trench in the substrate;
   conducting a first high-density plasma chemical vapor deposition to form a first insulation layer, wherein the first high-density plasma chemical vapor deposition is carried out at an etching/deposition ratio of about 0.15 to 0.6;
   conducting a second high-density plasma chemical vapor deposition to form a second insulation layer over the substrate that completely fills the trench, wherein the second high-density plasma chemical vapor deposition is carried out at an etching/deposition ratio of about 0.02 to 0.15;
   removing material from the second insulation layer outside the trench region;

removing the mask layer; and removing the pad oxide layer to form a complete STI structure.

9. The method of claim 8, wherein before conducting the first stage high-density plasma chemical vapor deposition, the upper corners of the trench are rounded.

10. The method of claim 8, wherein the first stage high-density plasma chemical vapor deposition is conducted by applying a low frequency radio frequency at a power level of about 2700W to 4500W and high frequency radio frequency at a power level of about 2700W to 4000W, and using a mixture of gaseous reactants including silane, oxygen and nitrogen.

11. The method of claim 10, wherein the mixture of gaseous reactants in the first stage high-density plasma chemical vapor deposition is produced by introducing silane at a flow rate of about 80 sccm to 150 sccm, oxygen at a flow rate of about 120 sccm to 210 sccm and nitrogen at a flow rate of about 180 sccm to 280 sccm.

12. The method of claim 8, wherein the first insulation layer includes a silicon oxide layer.

13. The method of claim 8, wherein the second stage high-density plasma chemical vapor deposition is conducted by applying a low frequency radio frequency at a power level of about 3700W to 5000W and high frequency radio frequency at a power level of about 1400W to 2700W, and using a mixture of gaseous reactants including silane, oxygen and nitrogen.

14. The method of claim 13, wherein the mixture of gaseous reactants in the second stage high-density plasma chemical vapor deposition is produced by introducing silane at a flow rate of about 100 sccm to 200 sccm, oxygen at a flow rate of about 180 sccm to 280 sccm and nitrogen at a flow rate of about 350 sccm to 460 sccm.

15. The method of claim 8, wherein the second insulation layer includes a silicon oxide layer.

16. The method of claim 8, wherein the first and the second high-density plasma chemical vapor deposition process are conducted in a same reaction chamber in sequence.

* * * * *